(12) United States Patent
Haba et al.

(10) Patent No.: US 8,410,618 B2
(45) Date of Patent: Apr. 2, 2013

(54) MICROELECTRONIC ASSEMBLY WITH JOINED BOND ELEMENTS HAVING LOWERED INDUCTANCE

(75) Inventors: Belgacem Haba, Saratoga, CA (US);
Philip Damberg, Cupertino, CA (US);
Philip R. Osborn, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/196,192

(22) Filed: Aug. 2, 2011

(65) Prior Publication Data
US 2011/0285020 A1 Nov. 24, 2011

Related U.S. Application Data

(63) Continuation of application No. 12/793,824, filed on Jun. 4, 2010, now Pat. No. 8,008,785, which is a continuation-in-part of application No. 12/644,476, filed on Dec. 22, 2009, now abandoned.

(60) Provisional application No. 61/322,404, filed on Apr. 9, 2010.

(30) Foreign Application Priority Data

Apr. 30, 2010 (KR) .................. 10-2010-0040446

(51) Int. Cl.
*H01L 23/48* (2006.01)
*H01L 23/52* (2006.01)
*H01L 29/40* (2006.01)

(52) U.S. Cl. ........................ 257/784; 257/786
(58) Field of Classification Search .................. 257/784, 257/786, 780, 781
See application file for complete search history.

(56) References Cited

U.S. PATENT DOCUMENTS

| | | | |
|---|---|---|---|
| 5,412,247 A | 5/1995 | Martin | |
| 6,169,331 B1 | 1/2001 | Manning et al. | |
| 6,339,260 B1 | 1/2002 | Kwon | |
| 6,457,235 B1 | 10/2002 | Chuo et al. | |
| 7,391,121 B2 * | 6/2008 | Otremba | 257/784 |

(Continued)

FOREIGN PATENT DOCUMENTS

| | | |
|---|---|---|
| JP | 1990215137 A | 4/1991 |
| JP | 2000114452 A | 4/2000 |

(Continued)

OTHER PUBLICATIONS

International Search Report, PCT/US2010/003213, dated Dec. 5, 2011.

(Continued)

*Primary Examiner* — S. V. Clark
(74) *Attorney, Agent, or Firm* — Lerner, David, Littenberg, Krumholz & Mentlik, LLP

(57) ABSTRACT

A microelectronic assembly includes a semiconductor chip having chip contacts exposed at a first face and a substrate juxtaposed with a face of the chip. A conductive bond element can electrically connect a first chip contact with a first substrate contact of the substrate, and a second conductive bond element can electrically connect the first chip contact with a second substrate contact. The first bond element can have a first end metallurgically joined to the first chip contact and a second end metallurgically joined to the first substrate contact. A first end of the second bond element can be metallurgically joined to the first bond element. The second bond element may or may not touch the first chip contact or the substrate contact. A third bond element can be joined to ends of first and second bond elements which are joined to substrate contacts or to chip contacts. In one embodiment, a bond element can have a looped connection, having first and second ends joined at a first contact and a middle portion joined to a second contact.

22 Claims, 9 Drawing Sheets

U.S. PATENT DOCUMENTS

| | | |
|---|---|---|
| 7,443,042 B2 | 10/2008 | Bambridge et al. |
| 7,582,832 B2 | 9/2009 | Reinold et al. |
| 7,777,353 B2 | 8/2010 | Ohkawa |
| 8,008,785 B2 | 8/2011 | Haba et al. |
| 2002/0089070 A1 | 7/2002 | Manning et al. |
| 2003/0089758 A1 | 5/2003 | Lee |
| 2003/0205725 A1* | 11/2003 | Masumoto et al. ........... 257/200 |
| 2004/0119172 A1 | 6/2004 | Downey et al. |
| 2005/0205995 A1 | 9/2005 | Ishikawa et al. |
| 2005/0258538 A1 | 11/2005 | Gerber |
| 2007/0252272 A1 | 11/2007 | Yano et al. |
| 2008/0023831 A1* | 1/2008 | Nishimura et al. ........... 257/737 |
| 2008/0116591 A1* | 5/2008 | Hayashi et al. ............... 257/784 |
| 2008/0246129 A1 | 10/2008 | Oga |
| 2010/0171204 A1 | 7/2010 | Chen |
| 2011/0147928 A1 | 6/2011 | Haba et al. |

FOREIGN PATENT DOCUMENTS

| | | |
|---|---|---|
| JP | 2005251957 A | 9/2005 |
| JP | 2006261173 A | 9/2006 |
| JP | 2007150144 A | 6/2007 |
| JP | 2007324604 A | 12/2007 |
| JP | 2008288229 A | 11/2008 |
| JP | 2009-124075 A | 6/2009 |
| KR | 20020032175 A | 5/2002 |
| KR | 20050048430 A | 5/2005 |

OTHER PUBLICATIONS

Benton et al., Electric Packaging and Production, Cahners Publishing Co., Newton Mass., US, 34(11); 30-32 (1994).

* cited by examiner

MICROELECTRONIC ASSEMBLY WITH JOINED BOND ELEMENTS HAVING LOWERED INDUCTANCE

CROSS-REFERENCE TO RELATED APPLICATIONS

This application is a continuation of U.S. application Ser. No. 12/793,824, filed on Jun. 4, 2010. Said U.S. application Ser. No. 12/793,824 claims priority from Korean Application No. 10-2010-0040446 filed Apr. 30, 2010 and claims the benefit of the filing date of U.S. Provisional Patent Application No. 61/322,404 filed Apr. 9, 2010. Said U.S. application Ser. No. 12/793,824 is a continuation-in-part of U.S. application Ser. No. 12/644,476, filed Dec. 22, 2009. The disclosures of all of the aforesaid applications are hereby incorporated herein by reference.

BACKGROUND

The subject matter of the present application relates to microelectronic packaging, and more particularly to microelectronic packaging in which a microelectronic element, e.g., a semiconductor chip is electrically connected with a substrate through bond elements such as bond wires, bond ribbons, etc., particularly where at least two bond elements are metallurgically joined together at least one end thereof.

Microelectronic elements, e.g., semiconductor chips, are typically flat bodies with oppositely facing, generally planar front and rear surfaces with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit (e.g. a circuit in an electronic product such as a computer or a cell phone) by connecting the package terminals to matching lands on a printed circuit board (PCB) by a suitable connection method such as soldering.

A common technique used to form electrically conductive connections between a microelectronic chip and one or more other electronic components is wire-bonding. Conventionally, a wirebonding tool attaches the end of a wire to a pad on a microelectronic chip using thermal and/or ultrasonic energy and then loops the wire to a contact on the other electronic component and forms a second bond thereto using thermal and/or ultrasonic forces.

SUMMARY

One of the challenges of wire-bond technology is that electromagnetic transmissions along a wire can extend into space surrounding the wire, and can induce currents in nearby conductors and cause unwanted radiation and detuning of the line. Wire-bonds generally are also subject to self-inductances and are subject to external noise (e.g. from nearby electronic components). These challenges can become more pronounced as the pitch between contacts on microelectronic chips and other electronic components becomes smaller, and as the chips operate at higher frequencies.

Various structures and techniques for manufacturing are described herein for a microelectronic assembly. In accordance with one embodiment, a microelectronic device such as a semiconductor chip can be wire-bonded to a package element within a microelectronic assembly such as a package. In one example, a package element can be a substrate or chip carrier having a dielectric element and a set of electrically conductive pads exposed at a surface of the dielectric element.

In accordance with one embodiment herein, a microelectronic assembly is provided which can include a semiconductor chip having a first face, a second face, and a plurality of chip contacts exposed at the first face. A substrate can be juxtaposed with one of the first or second faces. The substrate can have a plurality of substrate contacts exposed at a face of the substrate. The assembly can include a first electrically conductive bond element and a second electrically conductive bond element. The first and second bond elements can each be one of a bond ribbon or a bond wire. The first and second bond elements can electrically connect a chip contact with a corresponding substrate contact and provide parallel conductive paths between the chip contact and substrate contact. The first bond element can have a first end metallurgically joined to the chip contact and a second end metallurgically joined to the substrate contact. The second bond element can be metallurgically joined to the first and second ends of the first bond element. In accordance with a particular embodiment, the second bond element can be joined to the first bond element in such manner that it does not touch either the chip contact or the substrate contact.

In accordance with a particular aspect of the invention, the first electrically conductive bond element can be a first bond wire and the second electrically conductive bond element can be a second bond wire.

In one embodiment, one of the first and second ends of the first bond wire can include a ball, and the second bond wire can include a ball. The ball of the second bond wire can be metallurgically joined to the ball of the first bond wire.

In another embodiment, one of the first and second ends of the first bond wire can include a ball, the second bond wire can have a first end including a ball and a second end remote therefrom, and the second end of the second bond wire can be metallurgically joined to the ball of the first bond wire.

In accordance with one embodiment, the first bond element can be a lead bond, and the second bond element can be a bond wire.

In accordance with another embodiment herein, a microelectronic assembly is provided which can include a semiconductor chip having a first face, a second face, and a plurality of chip contacts exposed at the first face. A substrate can be juxtaposed with one of the first or second faces. The substrate can have a plurality of substrate contacts thereon. Such assembly can further include a first electrically conductive bond element connecting a first pair of a substrate contact and a chip contact. The first bond element can be a lead bond or a bond wire. The assembly can further include a second electrically conductive bond element connecting a second pair of a substrate contact and a chip contact. The second bond element can also be a lead bond or a bond wire.

A third electrically conductive bond element, being a ribbon bond or a bond wire, can be joined to ends of the first and second bond elements. The third bond element can be joined to the first and second bond elements in such manner that it does not touch either the chip contact or the substrate contact.

In accordance with one embodiment, the joints of the third bond element with the first and second bond elements can be adjacent the chip contacts.

In accordance with one embodiment, the joints of the third bond element with the first and second bond elements can be adjacent the substrate contacts.

In accordance with one embodiment, each of the first, second and third bond elements can be bond wires.

In accordance with one embodiment, the first and second bond elements can be lead bonds and the third bond element can be a bond wire.

In accordance with one embodiment herein, a microelectronic assembly can include a semiconductor chip having a first face, a second face, and a plurality of chip contacts exposed at the first face. A substrate can be juxtaposed with one of the first or second faces. The substrate can have a plurality of terminals thereon and leads electrically connected with the terminals and extending away therefrom. At least one of the leads can have an end bonded to a chip contact exposed at the first face of the chip. A bond wire can have a first end metallurgically joined to the end of the lead. The bond wire can be joined in such manner that it does not touch the chip contact. The bond wire can have a second end, remote from the first end, that is metallurgically joined to the lead at a location spaced apart from the chip contact.

In accordance with one embodiment, the second end of the bond wire can be joined to the lead at a location where the lead overlies the substrate.

In accordance with one embodiment herein, a microelectronic assembly can include a semiconductor chip having a first face, a second face, and a plurality of chip contacts exposed at the first face. A substrate can be juxtaposed with one of the first or second faces, the substrate having a plurality of substrate contacts thereon. The assembly can further include a plurality of electrically conductive bond elements. A bond element can be a bond ribbon or a bond wire, and the bond element can electrically connect a pair of a chip contact and a corresponding substrate contact. At least one bond element can have first and second ends connected to a first contact of such pair of the contacts. A middle portion between the first and second ends can be metallurgically joined with the second contact of the pair of contacts. In such way, the at least one bond element can extend in a continuous loop from the first end at the first contact, through a joint between the middle portion with the second contact, and can return in the continuous loop from the second contact to the first contact.

In accordance with one embodiment, the second end can be joined to the first end such that the second end does not touch the first contact.

In accordance with one embodiment, each of the first and second ends can be joined directly to the first contact.

In accordance with one embodiment, the at least one bond element can be a bond wire.

In accordance with one embodiment, the at least one bond element can be a bond ribbon. In a particular embodiment of the invention, a microelectronic assembly is provided in which a semiconductor chip has a first face, a second face remote from the first face, and a plurality of chip contacts exposed at the first face. A substrate can be juxtaposed with one of the first or second faces, the substrate having a plurality of substrate contacts. The assembly can include a first electrically conductive bond element and a second electrically conductive bond element. The first and second bond elements can each be one of a bond ribbon or a bond wire, the first bond element electrically connecting a first chip contact of the plurality of chip contacts with a first substrate contact of the plurality of substrate contacts, and the second bond element electrically connecting the first chip contact with a second substrate contact of the plurality of substrate contacts. The first bond element can have a first end metallurgically joined to the first chip contact and a second end metallurgically joined to the first substrate contact. The second bond element can have a first end metallurgically joined to the first bond element so that that the second bond element does not touch the first chip contact.

In yet another embodiment of the invention, a microelectronic assembly is provided in which a semiconductor chip has a first face, a second face remote from the first face, and a plurality of chip contacts exposed at the first face. A substrate can be juxtaposed with one of the first or second faces, the substrate having a plurality of substrate contacts. The assembly can include a first electrically conductive bond element and a second electrically conductive bond element. The first and second bond elements can each be one of a bond ribbon or a bond wire, the first bond element electrically connecting a first chip contact of the plurality of chip contacts with a first substrate contact of the plurality of substrate contacts, and the second bond element electrically connecting the first chip contact with a second substrate contact of the plurality of substrate contacts. The first bond element can have a first end metallurgically joined to the first chip contact and a second end metallurgically joined to the first substrate contact. The second bond element can have a first end metallurgically joined to the first end of the first bond element.

In yet another embodiment of the invention, a microelectronic assembly is provided in which a semiconductor chip has a first face, a second face remote from the first face, and a plurality of chip contacts exposed at the first face. A substrate can be juxtaposed with one of the first or second faces, the substrate having a plurality of substrate contacts. The assembly can include a first electrically conductive bond element and a second electrically conductive bond element. The first and second bond elements can each be one of a bond ribbon or a bond wire. The first bond element can have a first end metallurgically joined to the first chip contact and a second end metallurgically joined to the first substrate contact. The second bond element can have a first end metallurgically joined to the first bond element so that it does not touch the first chip contact. A second end of the second bond element can be metallurgically joined to the first substrate contact.

In a variation of such embodiment, the first end of the second bond element can be metallurgically joined to the first bond element and to the chip contact.

In accordance with one embodiment of the invention, a microelectronic assembly is provided which includes a semiconductor chip having a first face, a second face, and a plurality of chip contacts exposed at the first face. A substrate can be juxtaposed with one of the first or second faces, the substrate having a plurality of substrate contacts exposed at a face of the substrate. The assembly can include a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and first substrate contact. The first bond wire can have a first end metallurgically joined to the first chip contact and a second end metallurgically joined to the first substrate contact. One of the first and second ends of the first bond wire can include a ball, and one of the first and second ends of the second bond wire can include a ball. The ball of the second bond wire can be metallurgically joined directly to one of the first and second ends of the first bond wire, in such way that the second bond wire does not touch either the first chip contact or the first substrate contact.

In accordance with one or more aspects of the invention, the ball of the second bond wire can be metallurgically joined to the ball of the first bond wire. In accordance with another preferred aspect, an end of the second bond wire remote from the ball of the second bond wire is metallurgically joined to the ball of the first bond wire.

In accordance with another embodiment of the invention, a microelectronic assembly can include a semiconductor chip can have a first face, a second face, and a plurality of chip contacts exposed at the first face. A substrate can be juxtaposed with one of the first or second faces, the substrate having a plurality of substrate contacts thereon. The assembly can include a first electrically conductive bond element connecting a first pair of a substrate contact and a chip contact, and the first bond element can be one of a lead bond or a bond wire, for example. A second electrically conductive bond element can connect a second pair of a substrate contact and a chip contact, the first bond element being one of a lead bond or a bond wire. A third electrically conductive bond element, which can be a ribbon bond or a bond wire, for example, can be joined to ends of the first and second bond elements, wherein the third bond element does not touch the chip contact or the substrate contact of either the first or second pairs.

In one example, the joints of the third bond element with the first and second bond elements can be adjacent the chip contacts of the first and second pairs. In another example, the joints of the third bond element with the first and second bond elements can be adjacent the substrate contacts of the first and second pairs.

In a particular example, each of the first, second and third bond elements are bond wires. In another example, the first and second bond elements are lead bonds and the third bond element is a bond wire.

A microelectronic assembly in accordance with another embodiment can include a semiconductor chip having a first face, a second face, and a plurality of chip contacts exposed at the first face. A substrate can be juxtaposed with one of the first or second faces, the substrate having a plurality of terminals thereon and a plurality of leads electrically connected with the terminals and extending away therefrom. A first lead of the plurality of leads can have an end bonded to a first chip contact of the plurality of chip contacts. A bond wire can have a first end metallurgically joined to the end of the first lead, the bond wire not touching the first chip contact, and the bond wire having a second end metallurgically joined to the first lead at a location spaced apart from the first chip contact.

In a particular example, the second end of the bond wire can be joined to the first lead at a location where the first lead overlies the substrate.

In accordance with another embodiment of the invention, a microelectronic assembly can include a semiconductor chip having a first face, a second face, and a plurality of chip contacts exposed at the first face. A substrate can be juxtaposed with one of the first or second faces, the substrate having a plurality of substrate contacts thereon. The assembly can include a plurality of electrically conductive bond elements including a first bond element, the first bond element being a bond ribbon or a bond wire electrically connecting a pair of contacts. The pair of contacts can include a chip contact of the plurality of chip contacts and a corresponding substrate contact of the plurality of substrate contacts. The first bond element can have first and second ends electrically connected to a first contact of the pair of the contacts, and a middle portion between the first and second ends metallurgically joined with the second contact of the pair of contacts. In such assembly, the first bond element may extend in a continuous loop from the first end at the first contact, through the middle portion joined to the second contact and back to the second end connected to the first contact.

In one example, the second end of the first bond element can be joined to the first end. The second end may be joined in such manner that it does not touch the first contact. In another example, each of the first and second ends can be joined directly to the first contact.

In a particular example, the at least one bond element can be a bond wire. In another example, the at least one bond element can be a bond ribbon.

A microelectronic assembly in accordance with another embodiment of the invention can include a semiconductor chip having a first face, a second face, and a plurality of chip contacts exposed at the first face. A substrate can be juxtaposed with one of the first or second faces. The substrate can have a plurality of substrate contacts exposed at a face of the substrate. The assembly can include a first electrically conductive bond element and a second electrically conductive bond element, the first and second bond elements each being one of a bond ribbon or a bond wire. The first and second bond elements can electrically connect a first chip contact of the plurality of chip contacts with a corresponding first substrate contact of the plurality of substrate contacts and provide parallel conductive paths between the first chip contact and the first substrate contact. The first bond element can have a first end metallurgically joined to the first chip contact and a second end metallurgically joined to the first substrate contact. The second bond element can be metallurgically joined to the first and second ends of the first bond element.

A microelectronic assembly in accordance with another embodiment of the invention can include a semiconductor chip having a first face, a second face remote from the first face, and a plurality of chip contacts exposed at the first face. A substrate can be juxtaposed with one of the first or second faces, the substrate having a plurality of substrate contacts. The assembly can include a first electrically conductive bond element and a second electrically conductive bond element. Each of the first and second bond elements can be one of a bond ribbon or a bond wire. The first bond element can electrically connect a first chip contact of the plurality of chip contacts with a first substrate contact of the plurality of substrate contacts, and the second bond element can electrically connect the first chip contact with a second substrate contact of the plurality of substrate contacts. The first bond element can have a first end metallurgically joined to the first chip contact and a second end electrically connected to the first substrate contact. The second bond element can have a first end metallurgically joined to the first end of the first bond element so that that the second bond element does not touch the first chip contact.

In one example, each of the first and second bond elements can be a bond wire. One of the first and second ends of the first bond wire can include a ball, and the second bond wire can include a ball. In one example, a ball of the second bond wire can be metallurgically joined to the ball of the first bond wire. In another example, the second bond wire can have a first end including a ball and a second end remote therefrom, and the second end of the second bond wire can be metallurgically joined to the ball of the first bond wire.

In one example, at least one of the first or second bond elements can be a bond ribbon.

In a particular example, the microelectronic assembly can further include a third electrically conductive bond element electrically connecting the first substrate contact with the second substrate contact. In one example, the third bond element can be metallurgically joined to a second end of at least one of the first and second bond elements. The third bond element can be metallurgically joined to the second ends of each of the first and second bond elements. The third bond element can be arranged such that it does not touch any of the first or the second substrate contacts to which the first and second bond elements are bonded.

In one example, the third bond element can be metallurgically joined to the first and second substrate contacts.

In a particular example, the substrate can overlie the first face of the chip and have an opening exposing the plurality of chip contacts. The first and second bond elements may extend through the opening in the substrate.

In a particular example, a second face of the chip can overlie the substrate, and the first and second bond elements may extend beyond at least one edge of the chip.

A microelectronic assembly in accordance with another embodiment of the invention can include a semiconductor chip having a first face, a second face remote from the first face, and a plurality of chip contacts exposed at the first face. A substrate can be juxtaposed with one of the first or second faces, the substrate having a plurality of substrate contacts. The assembly can include a first electrically conductive bond wire and a second electrically conductive bond wire, the first and second bond wires electrically connecting a first chip contact of the plurality of chip contacts with a first substrate contact of the plurality of substrate contacts, and the second bond wire electrically connecting the first chip contact with a second substrate contact of the plurality of substrate contacts. The first bond wire can have a first end metallurgically joined to the first chip contact and a second end metallurgically joined to the first substrate contact. The second bond wire can have a first end metallurgically joined to the first end of the first bond wire.

In one example, the second bond wire can have a first end metallurgically joined to the first chip contact.

In a particular example, the microelectronic assembly can further include a third electrically conductive bond element which electrically connects the first substrate contact with the second substrate contact. The third bond element can be metallurgically joined to a second end of at least one of the first and second bond elements.

In one example, the third bond element can be metallurgically joined to the second ends of each of the first and second bond elements. In one example, the third bond element can be metallurgically joined to the first and second substrate contacts.

In one example, the substrate may overlie the first face of the chip and has an opening exposing the plurality of chip contacts. The first and second bond elements may extend through the opening in the substrate.

In one example, the second face of the chip can overlie the substrate, and the first and second bond elements can extend beyond at least one edge of the chip.

In one example, each of the first, second and third bond elements can be bond wires.

In one example, one of the first and second ends of the first bond wire can include a ball, and the first end of the second bond wire can include a ball. The ball of the second bond wire can be metallurgically joined directly to a first end of the first bond wire.

A microelectronic assembly in accordance with another embodiment of the invention can include a semiconductor chip having a first face, a second face remote from the first face, and a plurality of chip contacts exposed at the first face. A substrate can be juxtaposed with one of the first or second faces. The substrate may have a plurality of substrate contacts. The assembly may include a first electrically conductive bond element and a second electrically conductive bond element. Each the first and second bond elements can be a bond ribbon. The first and second bond elements can electrically connect a first chip contact of the plurality of chip contacts with a first substrate contact of the plurality of substrate contacts. The second bond element can electrically connect the first chip contact with a second substrate contact of the plurality of substrate contacts. The first bond element can have a first end metallurgically joined to the first chip contact and a second end metallurgically joined to the first substrate contact, and the second bond element can have a first end metallurgically joined to the first end of the first bond element. A third electrically conductive bond element can electrically connect the first substrate contact with the second substrate contact.

A microelectronic assembly in accordance with another embodiment of the invention can include a semiconductor chip having a first face, a second face remote from the first face, and a plurality of chip contacts exposed at the first face. A substrate can be juxtaposed with one of the first or second faces, the substrate having a plurality of substrate contacts. The assembly can include a first electrically conductive bond wire and a second electrically conductive bond wire, the first and second bond wires electrically connecting a first chip contact of the plurality of chip contacts with a first substrate contact of the plurality of substrate contacts. The first bond wire can have a first end metallurgically joined to the first chip contact and a second end electrically connected to the first substrate contact. The second bond wire can have a first end metallurgically joined to the first bond wire. The first end of the second bond wire can be arranged such that it does not touch the first chip contact.

In one example, the second end of the first bond element can be metallurgically joined to the first substrate contact.

In a particular example, the second end of the second bond element can be metallurgically joined to the first substrate contact.

In one example, one of the first and second ends of the first bond wire can include a ball, and the first end of the second bond wire can include a ball. The ball of the second bond wire can be metallurgically joined directly to the first end of the first bond wire.

DETAILED DESCRIPTION

Figure 1:
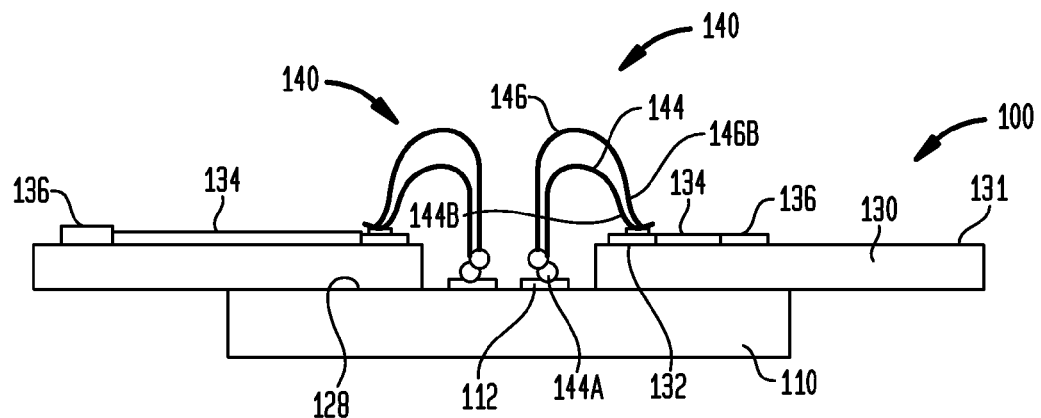
FIG. 1 is a sectional view of a microelectronic assembly in accordance with one embodiment.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

Wire bonds and other conductors used to connect a chip to another element, e.g., a substrate within a package, can have many different shapes and sizes. The wire used in forming wire bonds generally is cylindrical in cross-section. The wires typically are available in two diameters, 1 mil, or 0.001 inch, and 0.7 mil, or 0.007 inch. The inductance of a conductor is directly related to its length and inversely related to its cross-sectional area. Accordingly, bond wires typically have larger inductances than some other types of connections between a chip and substrate which are shorter or have larger cross-sectional area. Bond wires generally have larger inductances than the solder connections between a chip and a substrate in a flip-chip package, since the solder connections usually have larger diameters and shorter lengths than bond wires. Other types of connections between a chip and a substrate, such as lead bonds and ribbon bonds, are generally wider than bond wires, but have inductances which can be characterized in a similar way to wire bonds because of their lengths and relatively small cross-sectional areas.

As the number of pads on a chip increases without increasing the outline of a package, and as the operating frequency increases, it is desirable to provide a way of lowering the inductance of wire bonds in a package. As mentioned, the length and cross-sectional area of each wire bond are factors which largely determine the inductance. Unfortunately, within a given package, it is difficult to significantly reduce the length of a wire bond. Also, the wire used in wirebonding is available in standard diameters for use on equipment which is standardized in this respect. Therefore, it would be difficult to form wire bonds using wire that is larger in diameter than the most common standard diameters.

Accordingly, embodiments described herein provide ways of lowering the inductance of a wire bond. In an embodiment seen in FIGS. 1-2, one of the ways in which wire bond inductance can be reduced is by connecting a contact of a chip to a contact of a substrate via multiple bond wires. By using multiple bond wires, the cross-sectional area of the connection from the chip contact to the substrate contact is effectively increased, because current can now flow along both bond wires between the contacts.

Figure 2:
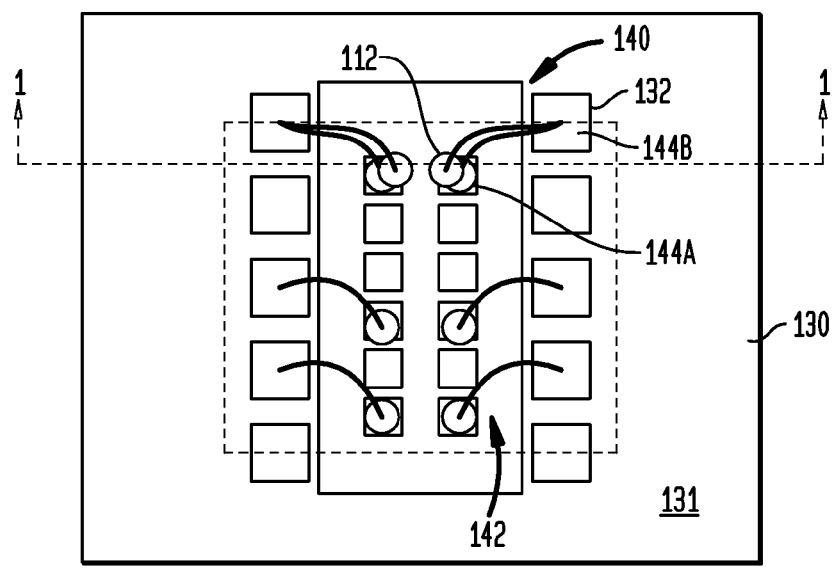
FIG. 2 is a corresponding plan view of a microelectronic assembly as seen in FIG. 1, the sectional view of FIG. 1 being taken through line 1-1 of FIG. 2.

For example, FIGS. 1-2 illustrate a microelectronic assembly 100 in accordance with one embodiment herein. The microelectronic assembly 100 can include a microelectronic element 110 which is electrically connected to a substrate 130. In an embodiment herein, the "substrate" can include a dielectric element bearing a plurality of traces and bond pads. Without limitation, one particular example of a substrate can be a sheet-like flexible dielectric element, typically made of a polymer, e.g., polyimide, among others, having metal traces and bond pads patterned thereon, the bond pads being exposed at at least one face of the dielectric element.

For ease of reference, directions may be stated in this disclosure with reference to a "top", i.e., contact-bearing surface 128 of a semiconductor chip 110. Generally, directions referred to as "upward" or "rising from" shall refer to the direction orthogonal and away from the chip top surface 128. Directions referred to as "downward" shall refer to the directions orthogonal to the chip top surface 128 and opposite the upward direction. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

The substrate 130 typically has an interconnection function. For example, the microelectronic subassembly can be an element of a package having a plurality of conductive leads or traces 134, a plurality of contacts 132 connected to the leads or traces arranged generally for interconnection with the microelectronic device, and a plurality of terminals 136 for interconnection to another element such as for external interconnection to a printed circuit board. The contacts 132 typically are in form of bond pads exposed at the upwardly directed face 131 of the substrate.

As seen in FIGS. 1-2, the chip can be connected to the substrate 130 via wire bond connections. The wire bond connections can include connections 140 in which multiple bond wires electrically connect one chip contact to a corresponding substrate contact. In addition, the wire bond connections can include other wire bond connections 142 in which only a single bond wire electrically connects a chip contact to a corresponding substrate contact.

Connections 140 which include multiple bond wires have a unique structure. In this case, as seen in FIG. 1, and as seen in greater detail in FIG. 3, a connection can include first and second bond wires 144, 146 which connect one chip contact 112 to a corresponding substrate contact 132. For example, the first bond wire 144 can have an end 144A metallurgically joined with the chip contact 112 and another end 144B metallurgically joined with the substrate contact 132. For example, the bond wires can include a metal such as gold which can be welded using ultrasonic energy, heat, or both, to a contact to form a metallurgical joint or bond therewith. In contrast, the second bond wire 146 can have one end 146A metallurgically bonded to the end 144A of the first bond wire 144. The second bond wire 146 can also have one end 146B metallurgically bonded to the end 144B of the first bond wire 144.

Figure 3:
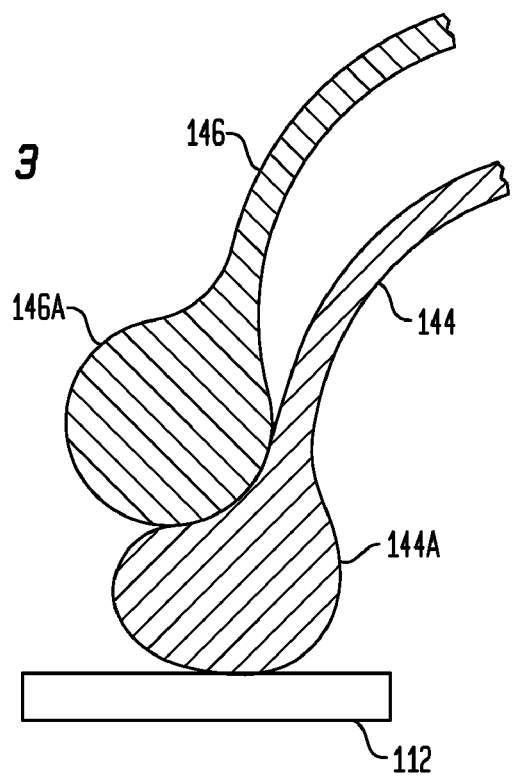
FIG. 3 is a fragmentary partial sectional view illustrating a connection between bond elements in a microelectronic assembly in an embodiment herein.

As seen in FIGS. 1 and 3, the second bond wire 146 need not touch the contacts 112, 132, i.e., the bond pads, to which the first bond wire 144 is metallurgically bonded. Instead, in a particular embodiment, the ends 146A, 146B of the second bond wire can be metallurgically bonded to the ends 144A, 144B of the first bond wire in such way the that second bond wire does not touch the contact at least one end of the second bond wire and may not touch the contacts at either end.

As seen in FIG. 3, an end 144A, 146A of each bond wire 144, 146 can include a ball formed during the wirebonding process. A wirebonding tool typically operates by advancing the tip of a gold wire from a spool to a tip of the tool. In one example of processing, when the tool is in position for forming a first wire bond at a first contact, e.g., chip contact 112, the tool can then apply ultrasonic energy, heat or both to the wire until the tip of the wire melts and forms a ball. The heated ball then metallurgically bonds with a surface of the contact. Then, when the tip of the wirebonding tool is moved away from the first contact, the ball remains bonded to the contact, while a length of the bond wire between such contact and a second contact is paid out. The wirebonding tool can then form another ball at the second end of the wire which is metallurgically joined to the second contact at that end.

The above process can then be repeated in a somewhat different fashion to form the second bond wire. In this case, the wirebonding tool can be moved into a position, and can then be used to heat the tip of the wire to form a ball which then metallurgically joins an end 146A of the second bond wire to the end 144A of the first bond wire. Similarly, when the wirebonding tool is in position to form a joint at the other end of the bond wire, the wirebonding tool can heat the tip of the wire and form a ball which metallurgically joins the end 146B to the end 144B of the bond wire.

In the example illustrated in FIGS. 1, 2, and 3, some of the contacts 132 can carry signals, i.e., voltages or currents which vary with time and which typically convey information. For example, without limitation, voltages or currents which vary with time and which represent state, change, a measurement, a clock or timing input or a control or feedback input are examples of signals. Others of the contacts 132 may provide connections to ground or a power supply voltage. A connection to ground or a power supply voltage typically provides a voltage which is at least fairly stable with time over frequencies of interest to the operation of the circuit.

One possible benefit of a multiple bond wire structure and method according to this embodiment is to reduce inductance when area for attaching a bond wire to a contact such as a bond pad on a chip or a substrate is limited. Some chips have particularly high contact density and fine pitch. The bond pads on such chips have very limited area. A structure in which a second bond wire has an end attached to an end of a first bond wire but which itself does not touch the contact can achieve a dual or multiple bond wire structure without requiring the size of the bond pad to be increased. Thus, a multiple bond wire structure as described with respect to FIGS. 1, 2 and 3 may be achieved even when forming wire bond connections to contacts which are arranged at a fine pitch or contacts which have small area.

Moreover, some such chips having high density also have high input and output rates, i.e., high frequencies at which signals are transmitted onto or off of the chip. At sufficiently high frequencies, the inductance of a connection can increase substantially. A multiple bond wire structure according to this embodiment can substantially decrease inductance of a wire bond connection by providing an additional path for current to flow between the connected contacts.

Figure 4:
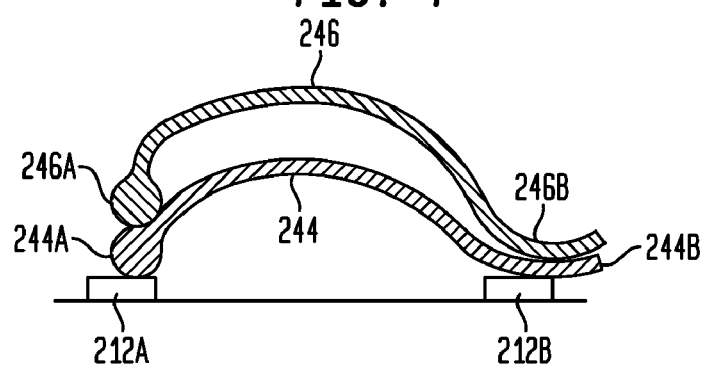
FIG. 4 is a fragmentary partial sectional view further illustrating a connection between bond elements in a microelectronic assembly in an embodiment herein.

FIG. 4 illustrates connections between a first bond wire 244 and a second bond wire 246 at ends thereof. As seen in FIG. 4, at first ends of the bond wires, the balls 244A and 246A can be metallurgically joined together, but in such manner that the ball of the second wire 246A does not touch the contact 212A. At second ends 244B, 246B of the bond wires at a second contact 212B, electrical connection can be made between the wires without balls being formed at the second ends 244A, 244B. In this case, one of the contacts 212A, 212B can be a chip contact exposed at a surface of the chip, and another one of the contacts 212A, 212B can be a substrate contact exposed at a surface of the substrate. Alternatively, both of the contacts 212A, 212B can be chip contacts or both contacts 212A, 212B can be substrate contacts.

Figure 5:
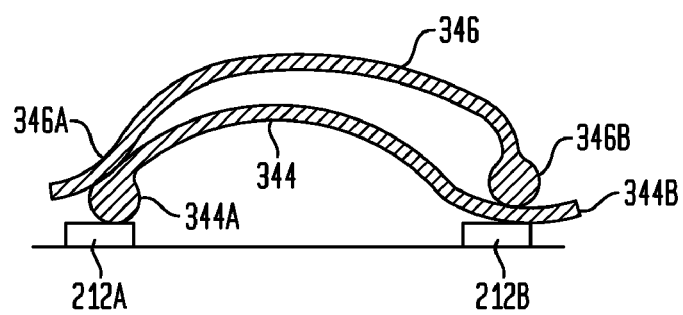
FIG. 5 is a fragmentary partial sectional view illustrating a connection between bond elements in a variation of a microelectronic assembly in an embodiment herein.

FIG. 5 illustrates a variation of such embodiment (FIG. 4) in which, at a first contact, the first bond wire 344 has a ball end 344A joined thereto. A wire end 346A of the second bond wire 346 is metallurgically joined to the ball end 344A of the first bond wire above the first contact 212A. In addition, at the second contact 212B, a ball end 346B of the second bond wire 346 is metallurgically joined to a wire end 344B of the first bond wire 344.

In another variation of the above-described embodiments, a plurality of bond wires can be formed and joined with a bond wire which is joined to the contacts at ends thereof to form three or more parallel paths between the contacts. In this embodiment, a third bond wire can be arranged such that the joints between it and first or second bond wires (e.g., wires 244, 246 (FIG. 4) or wires 344, 346 (FIG. 5) do not touch the contacts to which ends of the first bond wire are joined. If desired, an even greater number of bond wires can be used which are metallurgically joined in this manner to other bond wires, so as to provide parallel electrical paths for current to flow between a pair of contacts.

Figure 6:
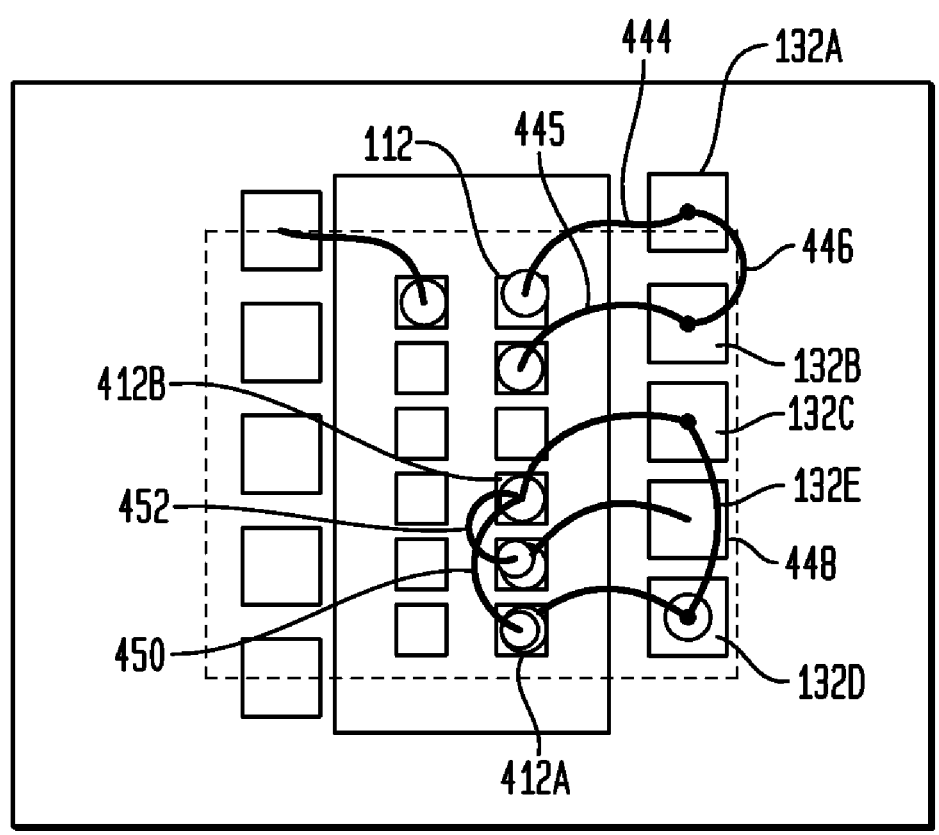
FIG. 6 is a plan view of a microelectronic assembly in accordance with one embodiment herein.

FIG. 6 illustrates a variation of the above-described embodiments in which a bond wire 446 is seen connected, i.e., metallurgically joined, to the ends of bond wires 444, 445 which are connected to two adjacent substrate contacts 132A and 132B. The additional bond wire 446 can be formed in a manner according to the embodiments described above (FIGS. 1-5). Again, the bond wire 446 need not touch the contacts 132A, 132B to which the first bond wires 444, 445 are metallurgically joined. Rather, an end of bond wire 446 can be joined to the end of another bond wire 444 which itself is joined to the contact, as seen for example, in FIG. 3, 4 or 5. Also, another end of bond wire 446 can be joined in similar manner to the end of bond wire 445 which is joined to the contact. As also seen in FIG. 6, in one variation, a similarly joined bond wire 448 can be joined to the ends of bond wires connected to non-adjacent substrate contacts 132C, 132D, such that it skips over a contact 132E that lies between the two contacts 132C, 132D. As further seen in FIG. 6, bond wires 450, 452 can be joined in similar manner to the ends of the other bond wires at the chip contacts. For example, bond wire 450 is joined to the ends of other bond wires which, in turn, are joined to contacts 412A and 412B.

Figure 7A:
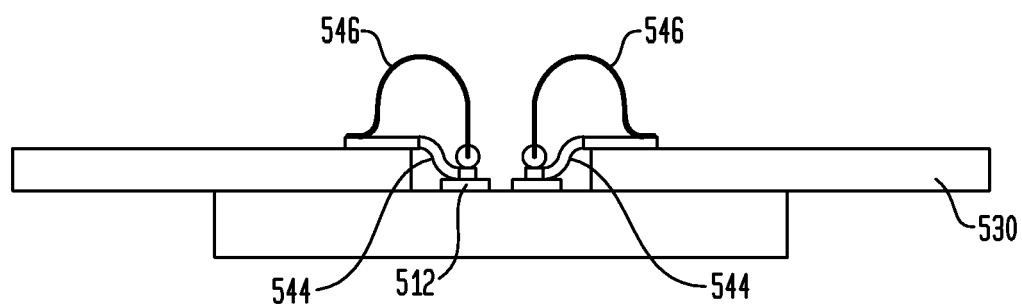
FIG. 7A is a sectional view of a microelectronic assembly in accordance with one embodiment herein.
Figure 7B:
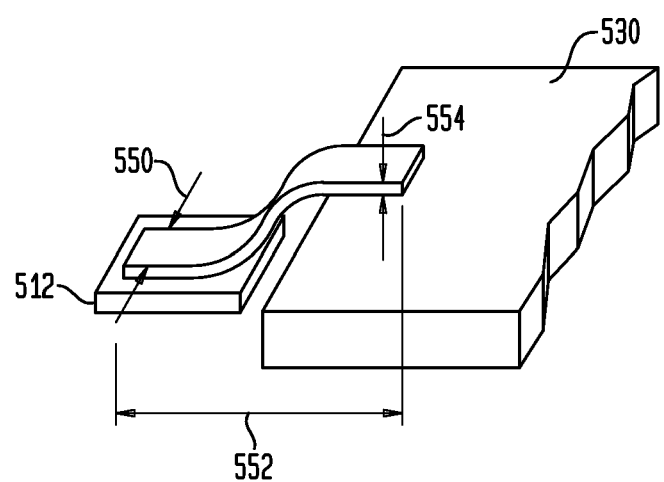
FIG. 7B is a fragmentary partial perspective view of a microelectronic assembly particularly illustrating a lead bond therein.

FIGS. 7A-7B illustrate another embodiment in which lead bonds 544 are provided on a substrate 530, the lead bonds extending from a surface of the substrate 530 to the contacts 512 of the chip where they are metallurgically joined thereto. As seen in the fragmentary perspective view provided in FIG. 7B, a lead bond typically is a long and flat element, having a length extending in a direction towards a chip contact 512 to which it is joined. The lead bond can have a width 550 extending in a direction transverse to its length, and a thickness 554 extending in a direction from the substrate surface. The length of a lead bond usually is greater than its width. The width of a lead bond usually is greater than its thickness. As seen in FIG. 7A, bond wires 546 can have ends joined to the lead bonds 544 at locations above the chip contacts and at locations above the substrate, in such manner that the bond wires 546 do not touch the contacts to which the lead bonds are joined. In such manner, the bond wires can provide parallel paths for current which can help lower the inductance of the lead bond connections between the substrate and the chip.

Figure 7C:
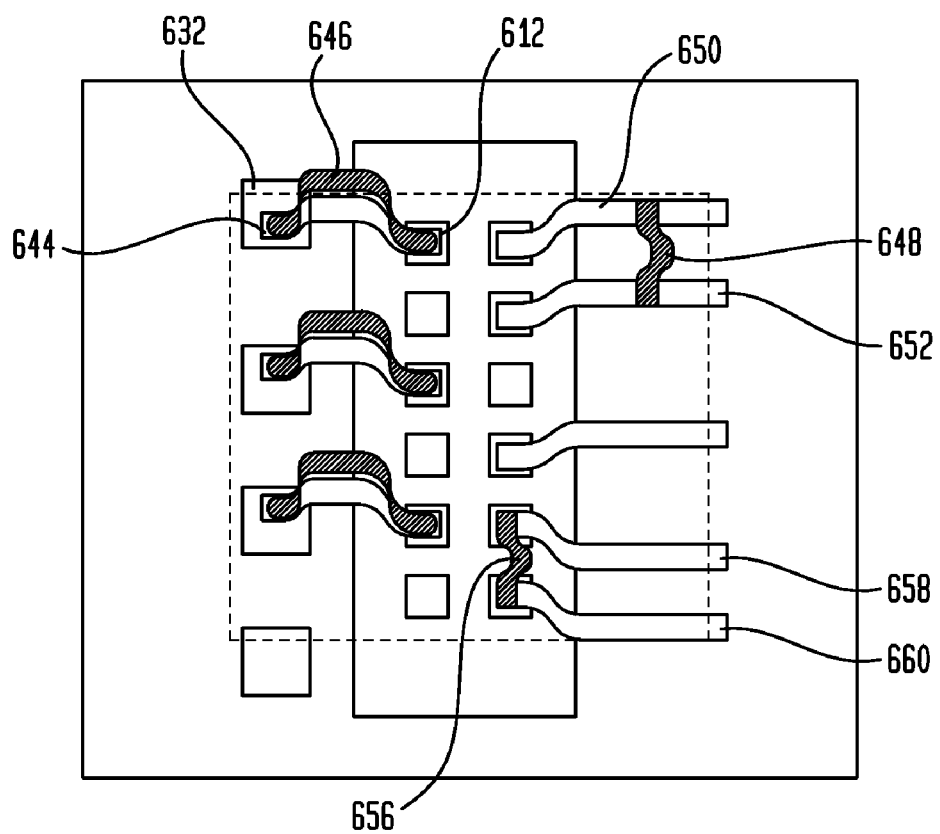
FIG. 7C is s plan view of a microelectronic assembly in accordance with one embodiment herein.

As further seen in FIG. 7C, in place of bond wires, it is possible to use other forms of bond elements to form parallel current paths between contacts. For example, a bond ribbon 646 can be used as an additional bond element joined to ends of a lead bond 644 that is joined to a chip contact 612 and a corresponding substrate contact 632, such that the bond ribbon 646 does not touch the contacts 612, 632. Like a lead bond, a bond ribbon 646 typically is a long and flat element, which, in like manner has a length extending in a direction to or from the chip contact 612 and a width extending in a direction transverse to length, and a thickness extending in a direction away from a surface to which it is joined, i.e., a surface of a lead bond to which it is joined. The width of the bond ribbon usually is greater than the thickness. A bond ribbon typically can be formed by a ribbon bonding tool in a manner similar to the process described above for forming bond wires.

In another variation, a bond ribbon 648 can be metallurgically joined to adjacent lead bonds 650, 652 above the substrate surface. In another variation, a bond ribbon 656 can be metallurgically joined to the ends of the adjacent lead bonds 658, 660 which are bonded to the chip contacts.

Figure 8:
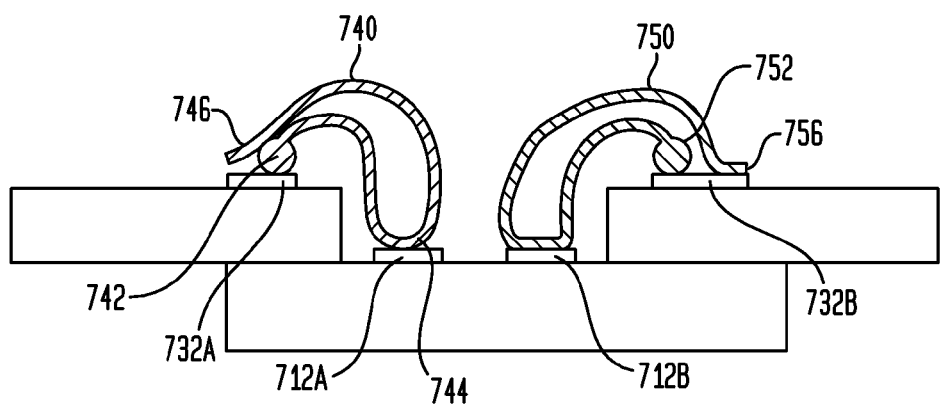
FIG. 8 is a sectional view of a microelectronic assembly in accordance with one embodiment herein.

FIG. 8 illustrates a variation of the above-described embodiment (FIGS. 1-2) in which a bond wire 740 has a looped connection, wherein two runs of the same bond wire extend between and are electrically connected to a pair of contacts. In this embodiment, a first ball end 742 can be metallurgically joined to one of the contacts (e.g., a substrate contact 732A). The bond wire 740 has a middle portion 744 which is metallurgically joined to the chip contact 712A, and has a second end 746 joined to the ball end 742 of the bond wire 740, in such manner that the second end 746 does not touch the contact 732A. In such manner, a single bond wire can be used to form parallel current paths between the same two contacts.

In one variation, FIG. 8 also shows an embodiment in which the second end 756 of one bond wire 750 is joined to the same contact 732B to which a first end 752 of the bond wire is joined. However, in this case, the second end 756 does touch the contact 732B, and can be joined directly thereto. In other embodiments, not shown, a similar looped connection can be made between two contacts of the substrate using a bond wire having a middle portion joined to one of the substrate contacts and ends joined to another one of the substrate contacts or having ends joined together with at least one of the ends joined to the substrate contact. In yet another variation, a similar looped connection can be made between two contacts of a chip using a bond wire having a middle portion joined to one of the chip contacts and ends joined to another one of the chip contacts, or having ends joined together with at least one of the ends joined to the chip contact.

Figure 9:
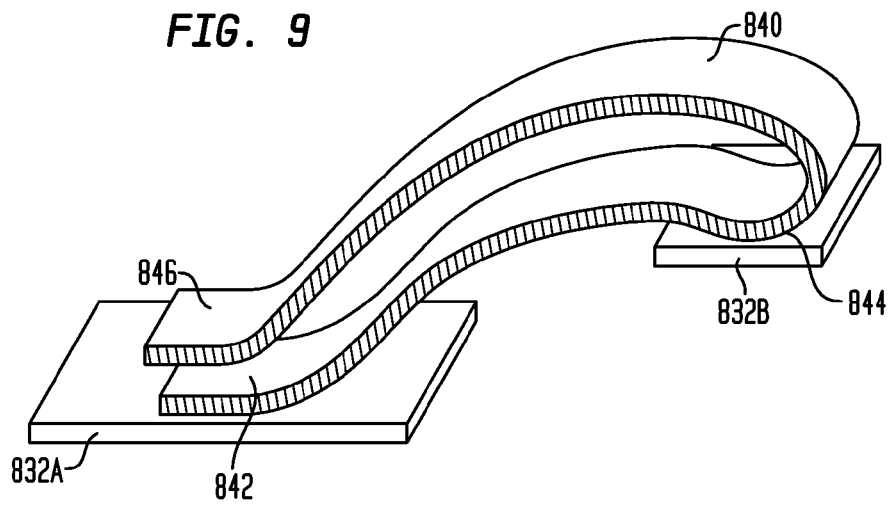
FIG. 9 is a fragmentary partial perspective view of a microelectronic assembly particularly illustrating a looped connection including a ribbon bond therein.

FIG. 9 illustrates a variation similar to FIG. 8 in which a bond ribbon 840 is used instead of a bond wire, wherein the bond ribbon 840 has a first end 842 metallurgically joined to one of the contacts (e.g., contact 832A). The bond wire 840 has a middle portion 844 which is metallurgically joined to another contact 832B, and has a second end 846 joined to the first end 842 of the bond ribbon. The joint between the first and second ends 842, 846 of the bond ribbon can be such that the second end 846 does not touch the contact 832A to which the first end is joined. Alternatively, in one variation (not shown), the second end 842 can touch or be joined directly with the same contact 832A to which the first end 846 is joined, similar to the arrangement of bond wire 750 in FIG. 8. One of the contacts, e.g., one of contacts 832A, 832B can be a substrate contact and another one of the contacts 832A, 832B can be a chip contact. Alternatively, both of the contacts 832A, 832B can be substrate contacts exposed at a surface of a substrate, or both contacts 832A, 832B can be chip contacts exposed at a surface of a chip.

In a variation (FIG. 10) of the above-described embodiment (FIGS. 1 through 5), a microelectronic assembly 900 can include first and second bond elements 944, 946, each being a bond wire, or alternatively, a bond ribbon, and each having first ends 944A, 944B electrically connected to a first chip contact 112 exposed at a first face 128 of a semiconductor chip 110. A substrate 130 is juxtaposed with the first face 128 of the chip 130, the substrate having an opening 920 exposing a plurality of chip contacts including first chip contact 112, such that the first and second bond elements 944, 946 extend through the opening in the substrate. Second ends 944A, 946B of the bond elements can be electrically connected to respective substrate contacts exposed at a face 131 of the substrate 130.

Figure 10:
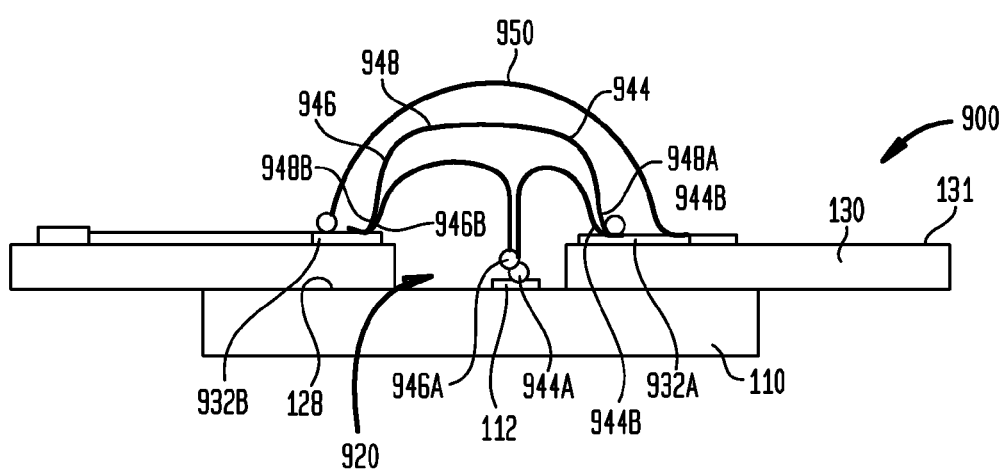
FIG. 10 is a sectional view illustrating a microelectronic assembly in accordance with a variation of the embodiment shown in FIGS. 1 through 5.

As further seen in FIG. 10, the first bond element can have a first end 944A metallurgically joined to the first chip contact and a second end 944B electrically connected or metallurgically joined to the first substrate contact 932A. Stated another way, the ends of the first bond element can be joined via a metal to metal joining process, with metal at the ends of the first bond element forming joints with metal of the first chip contact and first substrate contact. In addition, as further seen in FIG. 10, the second bond element can have a first end 946A which is metallurgically joined to the first bond element 944 and a second end 946B electrically connected or metallurgically joined to a second substrate contact 932B. The second bond element can be joined to the first bond element metallurgically, i.e., via a metal to metal joining process, with metal at the ends of the first and second bond elements forming a metal to metal joint. In a particular embodiment, as seen in FIG. 10, an end 946A of the second bond element 946 is joined with an end 944A of the first bond element 944. In a particular embodiment, as seen in FIG. 10, the second bond element 946 does not touch the first chip contact 112. Stated another way, the second bond element can be wholly separated from a surface of the first chip contact by the first bond element to which the second bond element is joined.

As particularly shown in FIG. 10, a ball end 946A of the second bond element is joined with a ball end 944A of the first bond element. However, alternatively, the first and second bond elements can be joined in accordance with the variation shown in FIG. 5.

As further seen in FIG. 10, a third electrically conductive bond element 948 can electrically connect the first substrate contact 932A with the second substrate contact 932B. The third bond element can be metallurgically joined to a second end 944B, or 946B of at least one of the first and second bond elements. In one embodiment, the ends 948A, 948B of the third bond element can be metallurgically joined to the second ends 944B, 946B of each of the first and second bond elements. In a particular embodiment, similar to the arrangement of the first end 946A of the second bond element relative to the first chip contact 112, the third bond element need not touch any of the first or the second substrate contacts 932A, 932B to which the first and second bond elements are joined. Alternatively, the third bond element can be as shown at 950 in which ends of the third bond are metallurgically joined to the first and second substrate contacts 932A, 932B.

Figure 11:
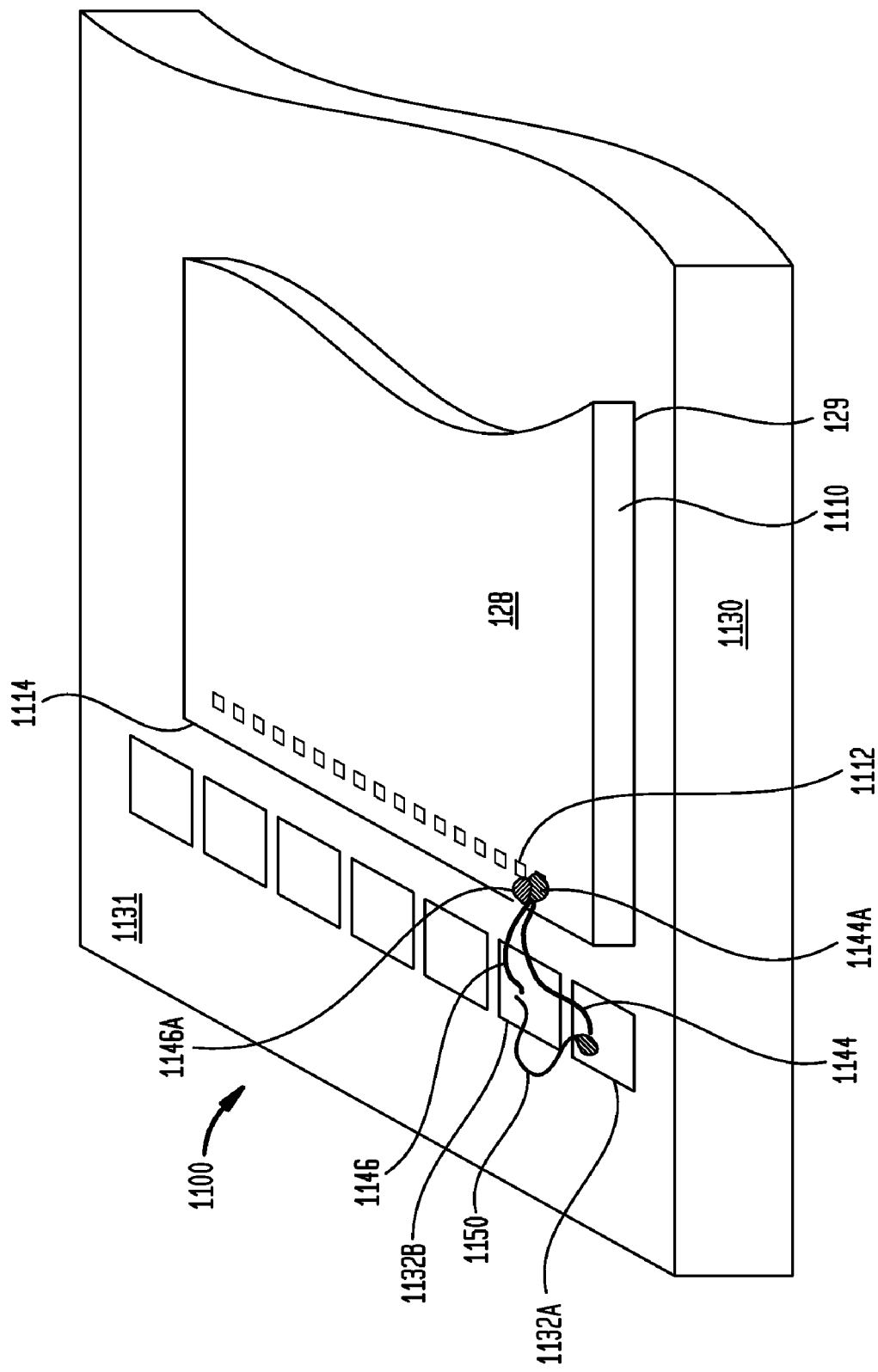
FIG. 11 is a fragmentary perspective view illustrating a microelectronic assembly in accordance with a variation of the embodiment shown in FIG. 10.

FIG. 11 illustrates a variation of the embodiment described above with reference to FIG. 10, in which the chip 1110 has a first face 128 with contacts 1112 exposed thereat, the chip having a second face 129 remote from the first face and a peripheral edge 1114 which extends between the first and second faces 128, 129. As seen in FIG. 11, the second face is juxtaposed with substrate 1130. As in the above-described embodiment (FIG. 10), first and second bond elements 1144, 1146 can have ends joined to each other; however, the second bond element need not touch the first chip contact 1112 to which the first bond element is metallurgically joined. The first and second bond elements 1144, 1146 can extend beyond the peripheral edge 1114 of the chip 1110. The first and second bond elements are metallurgically joined to respective first and second substrate contacts 1132A, 1132B exposed at a surface 1131 of the substrate.

FIG. 11 illustrates that a third bond element 1150 can electrically connect the first and second substrate contacts 1132A, 1132B. The connections between the third bond element and the first and second substrate contacts can be as described above with respect to FIG. 10.

Figure 12A:
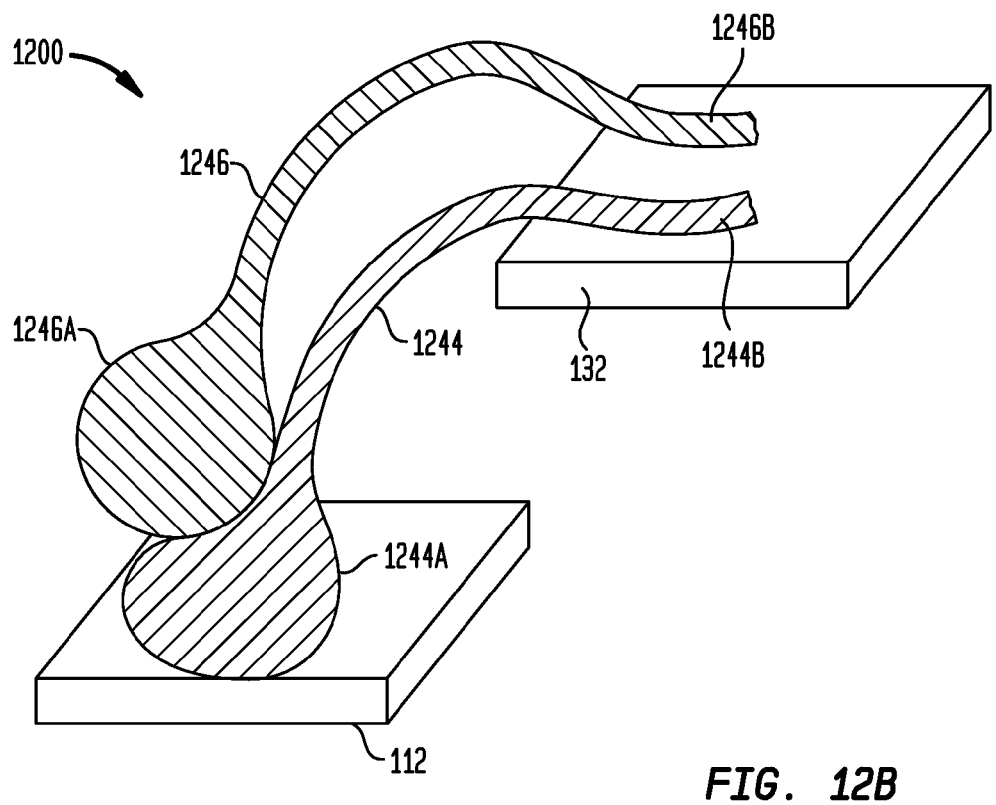
FIG. 12A is a fragmentary partial perspective view illustrating a microelectronic assembly in accordance with a variation of the embodiment shown in FIGS. 1 through 5.

FIG. 12A illustrates a microelectronic assembly in accordance with a variation of the embodiment described above with respect to FIGS. 1-5. In this variation, first and second bond elements 1244, 1246 have first ends 1144A, 1144B metallurgically joined together, as described above (FIGS. 1-5), wherein the first bond element 1244 is joined to a chip contact 112 exposed at a face of a semiconductor chip (not shown). As seen in the particular view of FIG. 12A, the bond elements can be bond wires and each first end 1244A, 1246A can include a ball. The second bond element 1246 (e.g., an end 1246A thereof) does not touch the first chip contact 112. As further seen in FIG. 12, second ends 1244B, 1246B of each of the first and second bond elements are metallurgically joined to a substrate contact 132 exposed at a surface of a substrate (not shown).

In a variation of the embodiment shown in FIG. 12A, each of the bond elements 1244, 1246 can be a bond wire and each first end 1244A, 1246A can be a wire end which is remote from the ball end of the bond wire, i.e., the end which includes a ball. In such variation, the first ends can resemble the wire ends 244B, 246B of the bond wires seen in FIG. 4. In a particular variation, the second end 1244B, 1246B of each bond wire includes a ball, each second end 1244B, 1246B being joined to the substrate contact 132.

In yet another variation of the embodiment shown in FIG. 12A, each of the bond elements can be a bond wire and the first ends 1244A, 1246A of the bond wires can be metallurgically joined together in a manner similar to the ends: ball end 344A, and wire end 346A of the first and second bond wires shown in FIG. 5. Specifically, a first end 1244A of one bond wire can include a ball and a first end 1246A of a second bond wire metallurgically joined thereto can include a wire end which is remote from the ball end of the second bond wire. Each of the second ends of the bond wires is joined to the substrate contact, as seen in FIG. 12A.

Figure 12B:
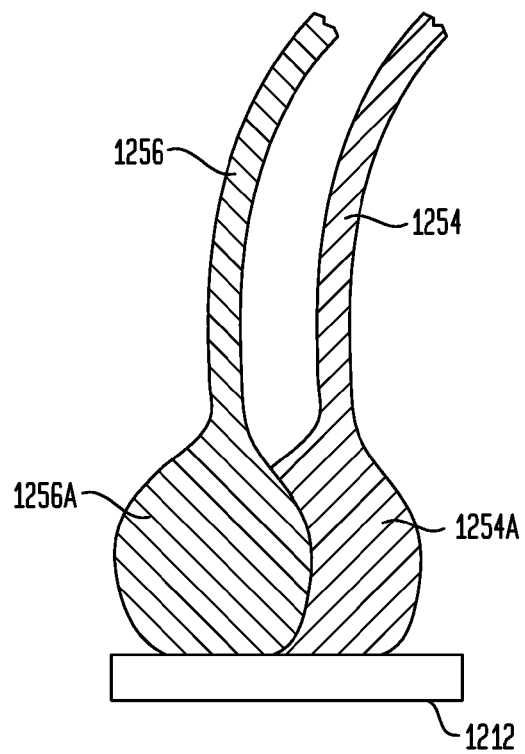
FIG. 12B is a fragmentary partial elevational view illustrating a microelectronic assembly in accordance with a variation of the embodiment shown in FIG. 12A.

As seen in FIG. 12B, in one variation of the above embodiment (FIG. 12A), the ends 1254A, 1254B of the bond elements 1254 and 1256 can be metallurgically joined to each other and also joined to the contact 112. In a specific embodiment as shown in FIG. 12B, each bond element can be a bond wire and the ball ends 1254A, 1256A of the bond wires can be metallurgically joined to the chip contact 1212 and to each other. Similar to the variations discussed above with respect to FIG. 12A, in further variations of that shown in FIG. 12B, the first ends 1254A, 1256A of the bond wires can be wire ends, or an end of a first bond wire can be a ball end and an end of a second bond wire can be a wire end, the first ends being metallurgically joined to each other and to the chip contact 1212.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
   a semiconductor chip having a first face, a second face, and a plurality of chip contacts exposed at the first face;
   a substrate juxtaposed with one of the first or second faces, the substrate having a plurality of substrate contacts exposed at a face of the substrate; and
   a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and the first substrate contact, the first bond wire having a first end metallurgically joined to the first chip contact and a second end metallurgically joined to the first substrate contact, the second bond wire being metallurgically joined to at least one of the first or second ends of the first bond wire,
   wherein the second bond wire is metallurgically joined to each of the first and second ends of the first bond wire.

2. A microelectronic assembly as claimed in claim 1, wherein one of the first and second ends of the first bond wire includes a ball, and the second bond wire includes a ball, wherein the ball of the second bond wire is metallurgically joined to the ball of the first bond wire.

3. A microelectronic assembly, comprising:
   a semiconductor chip having a first face, a second face, and a plurality of chip contacts exposed at the first face;
   a substrate juxtaposed with one of the first or second faces, the substrate having a plurality of substrate contacts exposed at a face of the substrate; and
   a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and the first substrate contact, the first bond wire having a first end metallurgically joined to the first chip contact and a second end metallurgically joined to the first substrate contact, the second bond wire being metallurgically joined to at least one of the first or second ends of the first bond wire,
   wherein one of the first and second ends of the first bond wire includes a ball, the second bond wire has a first end including a ball and a second end remote therefrom, the second end of the second bond wire being metallurgically joined to the ball of the first bond wire.

4. A microelectronic assembly as claimed in claim 2, wherein the ball of the second bond wire is joined to the first chip contact or the first substrate contact.

5. A microelectronic assembly as claimed in claim 2, wherein the second end of the second bond wire is joined to the first chip contact or the first substrate contact.

6. A microelectronic assembly as claimed in claim 2, wherein the ball of the second bond wire does not touch the first chip contact and does not touch the first substrate contact.

7. A microelectronic assembly, comprising:
a semiconductor chip having a first face, a second face, and a plurality of chip contacts exposed at the first face;
a substrate juxtaposed with one of the first or second faces, the substrate having a plurality of substrate contacts exposed at a face of the substrate; and
a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and the first substrate contact, the first bond wire having a first end metallurgically joined to the first chip contact and a second end metallurgically joined to the first substrate contact, the second bond wire being metallurgically joined to at least one of the first or second ends of the first bond wire,
wherein one of the first and second ends of the first bond wire includes a ball, and the second bond wire includes a ball, wherein the ball of the second bond wire is metallurgically joined to the ball of the first bond wire, and
wherein the second end of the second bond wire does not touch the first chip contact and does not touch the first substrate contact.

8. A microelectronic assembly as claimed in claim 7, wherein the ball of the second bond wire does not touch the first chip contact and does not touch the first substrate contact.

9. A microelectronic assembly as claimed in claim 1, further comprising a third electrically conductive bond wire electrically connecting the first substrate contact with a second substrate contact of the plurality of substrate contacts.

10. A microelectronic assembly as claimed in claim 9, wherein the third bond wire is metallurgically joined to an end of at least one of the first and second bond wires.

11. A microelectronic assembly, comprising:
a semiconductor chip having a first face, a second face, and a plurality of chip contacts exposed at the first face;
a substrate juxtaposed with one of the first or second faces, the substrate having a plurality of substrate contacts exposed at a face of the substrate; and
a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and the first substrate contact, the first bond wire having a first end metallurgically joined to the first chip contact and a second end metallurgically joined to the first substrate contact, the second bond wire being metallurgically joined to at least one of the first or second ends of the first bond wire,
and further comprising a third electrically conductive bond wire electrically connecting the first substrate contact with a second substrate contact of the plurality of substrate contacts
wherein the third bond wire is metallurgically joined to the second ends of each of the first and second bond wires.

12. A microelectronic assembly as claimed in claim 11, wherein the third bond wire does not touch any of the first or the second substrate contacts to which the first and second bond wires are bonded.

13. A microelectronic assembly as claimed in claim 11, wherein the third bond wire is metallurgically joined to the first and second substrate contacts.

14. A microelectronic assembly, comprising:
a semiconductor chip having a first face, a second face, and a plurality of chip contacts exposed at the first face;
a substrate juxtaposed with one of the first or second faces, the substrate having a plurality of substrate contacts exposed at a face of the substrate; and
a first electrically conductive bond wire and a second electrically conductive bond wire, the first and second bond wires electrically connecting a first chip contact of the plurality of chip contacts with a corresponding first substrate contact of the plurality of substrate contacts and providing parallel conductive paths between the first chip contact and the first substrate contact, the first bond wire having a first end metallurgically joined to the first chip contact and a second end metallurgically joined to the first substrate contact, the second bond wire being metallurgically joined to at least one of the first or second ends of the first bond wire,
wherein the substrate overlies the first face of the chip and has an opening exposing the plurality of chip contacts, wherein the first and second bond wires extend through the opening in the substrate.

15. A microelectronic assembly as claimed in claim 1, wherein the second face of the chip overlies the substrate, wherein the first and second bond wires extend beyond at least one edge of the chip.

16. A microelectronic assembly, comprising:
a semiconductor chip having a first face, a second face remote from the first face, and a plurality of chip contacts including a first chip contact exposed at the first face;
a substrate including a dielectric element, the dielectric element having a surface juxtaposed with one of the first or second faces, the substrate having a plurality of substrate contacts exposed at the surface including first and second substrate contacts in form of bond pads separated from one another in at least one direction along the surface; and
a first electrically conductive bond wire and a second electrically conductive bond wire, the first bond wire being a monolithic metal structure including a ball at a first end thereof metallurgically joined to the first chip contact and a wire portion formed integrally with the ball thereof and extending upwardly from the ball, the first bond wire having a second end electrically connected to the first substrate contact, the second bond wire being a monolithic metal structure including a ball at a first end thereof metallurgically joined to the ball of the first bond wire, and a wire portion of the second bond wire being formed integrally with the ball of the second bond wire and extending upwardly from the ball of the second bond wire, the second bond wire having a second end electrically connected to the second substrate contact.

17. A microelectronic assembly as claimed in claim 16, wherein the ball of the second bond wire does not touch the first chip contact.

18. A microelectronic assembly as claimed in claim 16, wherein each of the first and second bond wires has essentially the same metal composition.

19. A microelectronic assembly as claimed in claim 16, wherein the second end of the first bond wire is metallurgically joined to the first substrate contact.

20. A microelectronic assembly as claimed in claim 16, wherein the second end of the second bond wire is metallurgically joined to the second substrate contact.

21. A microelectronic assembly as claimed in claim 16, wherein each of the first and second bond wires consists essentially of gold.

22. A microelectronic assembly as claimed in claim 16, further comprising a third electrically conductive bond wire electrically connecting the first substrate contact with the second substrate contact.

* * * * *